United States Patent [19]
Liang

[11] Patent Number: 5,461,000
[45] Date of Patent: Oct. 24, 1995

[54] METHOD OF MANUFACTURING DIELECTRIC AS LOAD RESISTOR IN 4T SRAM

[75] Inventor: Mong-Song Liang, Hsin-Chu, Taiwan

[73] Assignee: Taiwan Semiconductor Manufacturing Company Ltd., Hsinchu, Taiwan

[21] Appl. No.: 270,756

[22] Filed: Jul. 5, 1994

[51] Int. Cl.$^6$ ............................................. H01L 21/8244
[52] U.S. Cl. ............................ 437/60; 437/46; 437/918
[58] Field of Search ............................... 437/46, 47, 60, 437/191, 195, 918; 148/DIG. 136

[56] References Cited

U.S. PATENT DOCUMENTS

| | | | |
|---|---|---|---|
| 4,755,480 | 7/1988 | Yau et al. | 437/918 |
| 4,950,620 | 8/1990 | Harrington, III | 437/60 |
| 5,126,279 | 6/1992 | Roberts | 437/918 |
| 5,200,356 | 4/1993 | Tanaka | 437/60 |
| 5,266,156 | 11/1993 | Nasr | 437/918 |
| 5,268,325 | 12/1993 | Spinner, III et al. | 437/60 |

OTHER PUBLICATIONS

Ghandhi, S. K., "Fabrication Principles, Silicon and Gallium Arsenide", 1983, pp. 372–373.

*Primary Examiner*—Chandra Chaudhari
*Attorney, Agent, or Firm*—George O. Saile; Graham S. Jones, II

[57] ABSTRACT

A method of for manufacture of a semiconductor device on a semiconductor substrate including an SRAM cell with a resistor comprises formation of a first polysilicon layer on the semiconductor substrate, patterning and etching the first polysilicon layer, formation of an interpolysilicon layer over the first polysilicon layer, patterning and etching an opening through the interpolysilicon layer exposing a contact area on the surface of the first polysilicon layer, forming a dielectric load resistor in the opening upon the contact area on the first polysilicon layer, and formation of a second polysilicon layer on the device over the dielectric load resistor, over the interpolysilicon layer.

14 Claims, 6 Drawing Sheets

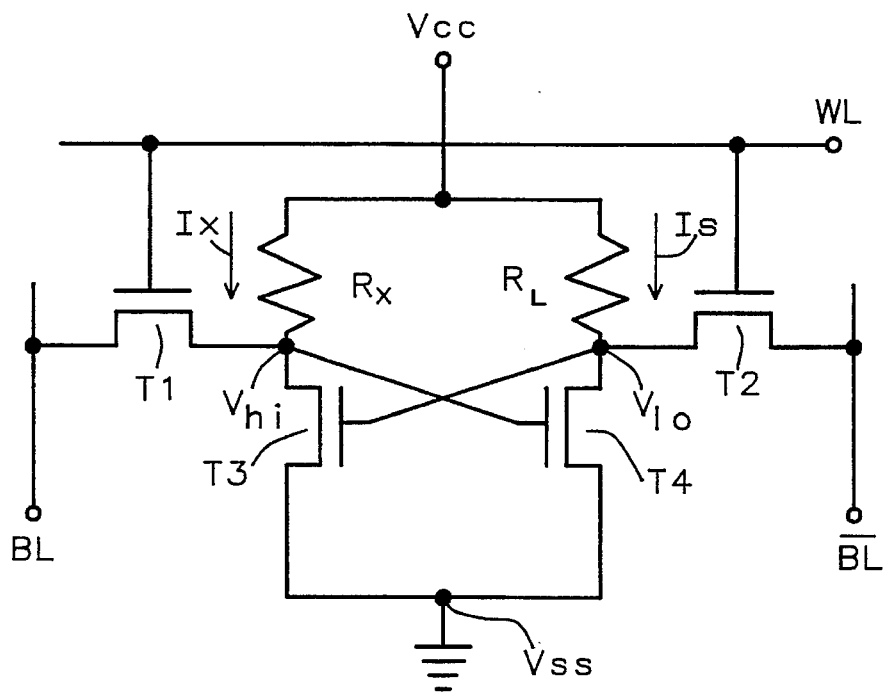
FIG. 1
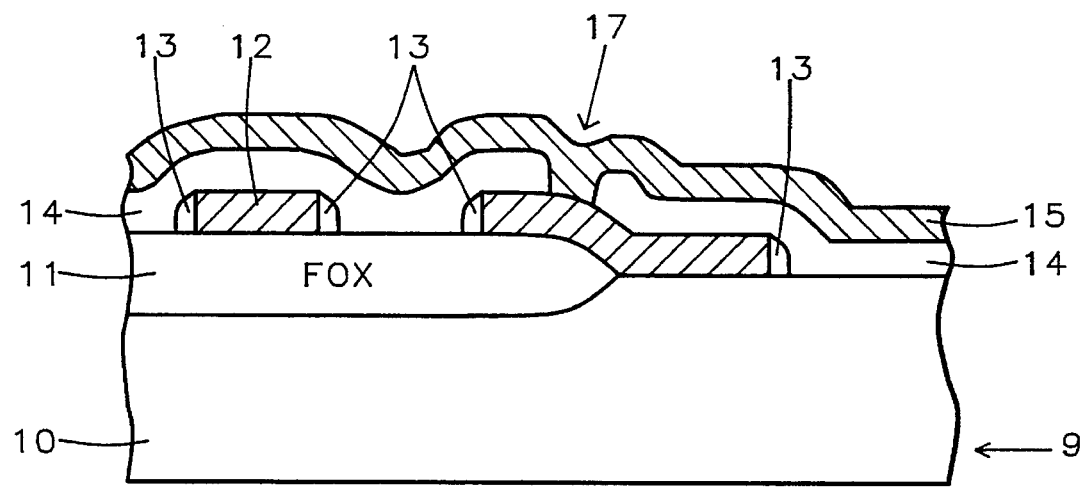
FIG. 2 - Prior Art

METHOD OF MANUFACTURING DIELECTRIC AS LOAD RESISTOR IN 4T SRAM

BACKGROUND OF THE INVENTION

1. Field of the Invention

This invention relates to SRAM memory devices and more particularly to improved load resistors therefor.

2. Description of Related Art

U.S. Pat. No. 5,200,356 of Tanaka for "Method of Forming a Static Random Access Memory Device" and U.S. Pat. No. 4,950,620 of Harrington for "Process for Making Integrated Circuit with Doped Silicon Dioxide Load Elements" show SRAM devices with load resistors formed by ion implantation of impurities in a silicon dioxide film.

U.S. Pat. No. 5,126,279 of Roberts for "Single Polysilicon Cross-Coupled Resistor, Six Transistor SRAM Cell Design Technique" shows an SRAM using polysilicon resistors.

U.S. Pat. No. 5,266,156 of Nsar for "Methods of Forming a Local Interconnect and a High Resistor Polysilicon Load by Reacting Cobalt with Polysilicon" and U.S. Pat. No. 5,268,325 of Spinner et al for "Method for Fabricating a Polycrystalline Silicon Resistive Load Element in an Integrated Circuit" show methods for making polysilicon load resistors.

FIG. 2 is a sectional view of a fragment of a prior art SRAM (Static Random Access Memory) device 9 with a substrate 10 composed of silicon. The device includes a FOX (field oxide) region 11 upon which a polysilicon 1 gates 12 and 16 are formed with silicon dioxide spacers 13 on either side. Polysilicon 1 gate 16 extends across the edge of the FOX region 11 in direct contact with the surface of the silicon substrate 10. Above that structure is formed an interpolysilicon structure 14 with an opening 17 therethrough above the gate 16. Next, a blanket layer 15 of undoped polysilicon 2 resistor material is formed over the preceding layers. Layer 15 in stacked contact through opening 17 with polysilicon 1 gate 16.

Prior art polysilicon ion implanted resistors have had a length of from about 2 µm to about 6 µm with a width of from 0.5 µm to 1.0 µm depending on the design rule or technology. For example, the resistor can be 2.6 µm long and 0.6 µm wide. Outside the masked area there is heavily doped polysilicon. The 2 µm to 4 µm length is provided to insure that there is enough of an undoped region for a high resistance value.

The problem with conventional polysilicon load resistors is that they suffer large resistance variations and high temperature coefficients.

SUMMARY OF THE INVENTION

In accordance with this invention, a method is provided for manufacture of a semiconductor device on a semiconductor substrate including an SRAM cell with a resistor comprising formation of a first polysilicon layer on the semiconductor substrate, patterning and etching the first polysilicon layer, formation of an interpolysilicon layer over the first polysilicon layer, patterning and etching an opening through the interpolysilicon layer exposing a contact area on the surface of the first polysilicon layer, forming a dielectric load resistor in the opening upon the contact area on the first polysilicon layer, and formation of a second polysilicon layer on the device over the dielectric load resistor, over the interpolysilicon layer. Preferably, the second polysilicon layer is ion implanted with a dose of ions selected from phosphorous ions and arsenic ions implanted within the range from about $5\times E14$ cm$^{-2}$ to about $1\times E16$ cm$^{-2}$ at from about 25 keV to about 60 keV as a function of the thickness of the second polysilicon layer; the resistor is formed from ONO (SiO$_2$/Silicon nitride/SiO$_2$); the resistor is formed from NO (Silicon nitride/SiO$_2$); or the resistor is formed from ON(SiO$_2$/Silicon nitride).

Preferably, the resistor is formed by cleaning the device, growing a native oxide (SiO$_2$) layer, deposition of Si$_3$N$_4$, and thermally growing SiO$_2$.

Preferably, the resistor is formed by cleaning the device, growing a native oxide (SiO$_2$) layer having a thickness of from about 5 Å to about 10 Å, deposition of Si$_3$N$_4$ having a thickness of from about 60 Å to about 80 Å, and thermally growing SiO$_2$ having a thickness of from about 5 Å to about 10 Å at from 700° C.–900° C. in steam.

An alternative preferred alternative is that the resistor is formed by deposition of Si$_3$N$_4$, and thermally growing SiO$_2$; the resistor is formed by deposition of Si$_3$N$_4$ having a thickness of from about 60 Å to about 80 Å, and thermally growing SiO$_2$ having a thickness of from about 5 Å to about 10 Å at from 700° C.–800° C. in steam; or the resistor is formed by applying a native oxide (SiO$_2$) layer, cleaning the device, and deposition of Si$_3$N$_4$.

Preferably, the resistor is formed by cleaning the device, forming a native oxide (SiO$_2$) layer having a thickness of from about 5 Å to about 10 Å, and deposition of Si$_3$N$_4$ having a thickness of from about 60 Å to about 80 Å.

In another aspect of this invention, a semiconductor device on a semiconductor substrate including an SRAM cell with a resistor comprises a patterned and etched first polysilicon layer on the semiconductor substrate, an interpolysilicon layer over the first polysilicon layer patterned with an opening through the interpolysilicon layer to a contact area on the surface of the first polysilicon layer, a dielectric load resistor in the opening upon the contact area on the first polysilicon layer, and a second polysilicon layer on the device over the dielectric load resistor, over the interpolysilicon layer.

Preferably the second polysilicon layer was ion implanted with a dose of ions selected from phosphorous ions and arsenic ions implanted within the range from about $5\times E14$ cm$^{-2}$ to about $1\times E16$ cm$^{-2}$ at from about 25 keV to about 60 keV as a function of the thickness of the second polysilicon layer.

It is preferred that the resistor comprises an ONO (SiO$_2$/Silicon nitride/SiO$_2$) composition, NO (Silicon nitride/SiO$_2$), or ON(SiO$_2$/Silicon nitride).

Preferably, the resistor comprises a native oxide (SiO$_2$) layer having a thickness of from about 5 Å to about 10 Å, a Si$_3$N$_4$ layer having a thickness of from about 60 Å to about 80 Å, and thermally grown SiO$_2$ having a thickness of from about 5 Å to about 10 Å at from 700° C.–800° C. in steam.

Alternatively, the resistor comprises a Si$_3$N$_4$ layer having a thickness of from about 60 Å to about 80 Å, and thermally grown SiO$_2$ having a thickness of from about 5 Å to about 10 Å at from 700° C.–800° C. in steam.

Another aspect is that the resistor comprises a native oxide (SiO$_2$) layer having a thickness of from about 5 Å to about 10 Å, a $Si_3N_4$ layer having a thickness of from about 60 Å to about 80 Å.

It is also preferred that the second polysilicon layer was ion implanted with a dose of ions selected from phosphorous ions and arsenic ions implanted within the range from about $5 \times E14$ cm$^{-2}$ to about $1 \times E16$ cm$^{-2}$ at from about 25 keV to about 60 keV as a function of the thickness of the second polysilicon layer.

An object of this invention is to maintain a controllable high value resistance even with a scaled layout. It also features small resistance temperature coefficients.

BRIEF DESCRIPTION OF THE DRAWINGS

The foregoing and other aspects and advantages of this invention are explained and described below with reference to the accompanying drawings, in which:

FIG. 1 shows an electrical schematic diagram of a four MOS transistor (4T) SRAM (Static Random Access Memory) cell comprising two cross-coupled transistors including pass (transfer) transistors and driver transistors.

FIG. 2 is a sectional view of a fragment of a prior art SRAM (Static Random Access Memory) device.

DESCRIPTION OF THE PREFERRED EMBODIMENTS

FIG. 1 shows an electrical schematic diagram of a four MOS transistor (4T) SRAM (Static Random Access Memory) cell comprising two cross-coupled transistors including pass (transfer) transistors T1 and T2 and driver transistors T3 and T4.

Driver transistors T3 and T4 have their drains connected respectively to nodes $V_{hi}$ and $V_{lo}$ and their gates connected respectively to nodes $V_{lo}$ and $V_{hi}$. Pass transistors T1 and T2 have their gates connected to word line WL. In addition, the SRAM cell of FIG. 1 includes two resistors, load resistor $R_L$ connected between terminal $V_{cc}$ and node $V_{lo}$ which is connected to the S/D circuit of transistor T4, resistor $R_x$ connected between terminal $V_{cc}$ and node $V_{hi}$ which is connected to the S/D circuit of transistor T3. The other ends of the S/D circuits of transistors T3 and T4 are connected to $V_{ss}$ (ground level.)

Pass transistor T1 and pass transistor T2 have their gates connected to word line WL and their S/D circuits respectively connected between node $V_{hi}$ and bit line BL for transistor T1 and node $V_{lo}$ and bit line BL-bar for transistor T2. The drain of pass transistor T1 is connected to node $V_{hi}$. The drain of pass transistor T2 is connected to node $V_{lo}$. The current $I_s$ flows from terminal $V_{cc}$ through load resistor $R_L$ to node $V_{lo}$. The current $I_x$ flows from terminal $V_{cc}$ through load resistor $R_x$ to node $V_{hi}$.

When the word line WL is driven high, pass transistors T1 and T2 are turned on. As a result, the one of the driver transistors T3 and T4 currently on (depending upon data stored in the cell) will sink current through pass transistor T1 or T2 from the bit line BL or BL-bar, which initiates a change in the voltage on that bit line. A sense amplifier can sense the changing voltage differential across the bit line pair and provide an corresponding digital output. In the write mode, a desired data signal is sent from the bit lines to the pass transistors T1 and T2 turning them on to reset the driver transistors T3 and T4.

The resistance of a resistor structure is defined by the equation as follows:

$$R = rho \frac{L}{A}$$

where rho=resistivity

L=length

A=cross sectional area.

In order to have a high load resistance, the load resistor can be increased in value by increasing its length.

FIGS. 3-8 illustrate a preferred process of making a device in accordance with this invention.

Figure 3:
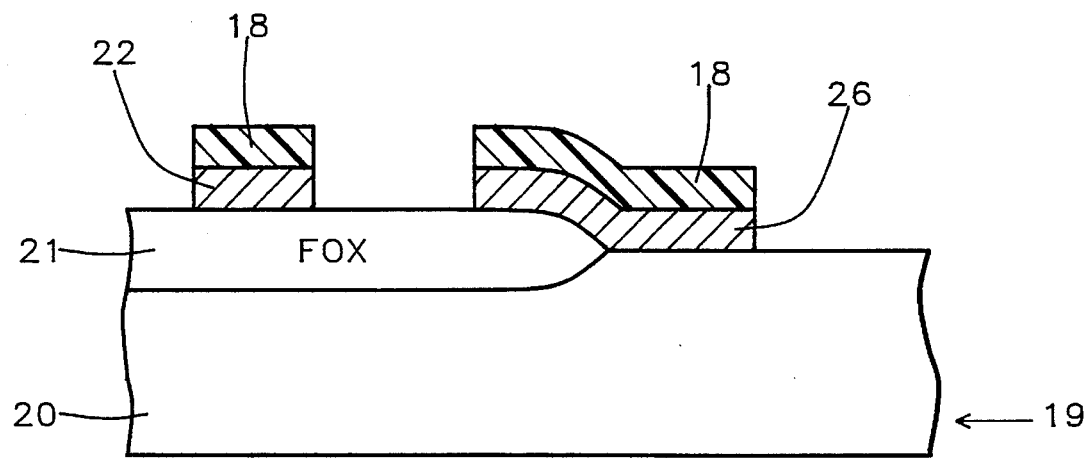
FIGS. 3-8 illustrate a preferred process of making a device in accordance with this invention.

In brief, FIG. 3 shows the results of the preliminary set of steps of manufacture of a device formed on silicon semiconductor substrate 20. Initially a blanket polysilicon 1 layer indicated by polysilicon 1 gate structures 22, 26 has been applied over the substrate 20 by a conventional process. Then a blanket layer of photoresist formed into photoresist mask 18 has been applied over the device and patterned by a conventional photolithographic process in the shape of polysilicon 1 structures 22 and 26 to be produced. Then with the mask in place, the polysilicon 1 layer (22, 26) is etched through the mask to produce the polysilicon structures 22 and 26.

Figure 4:
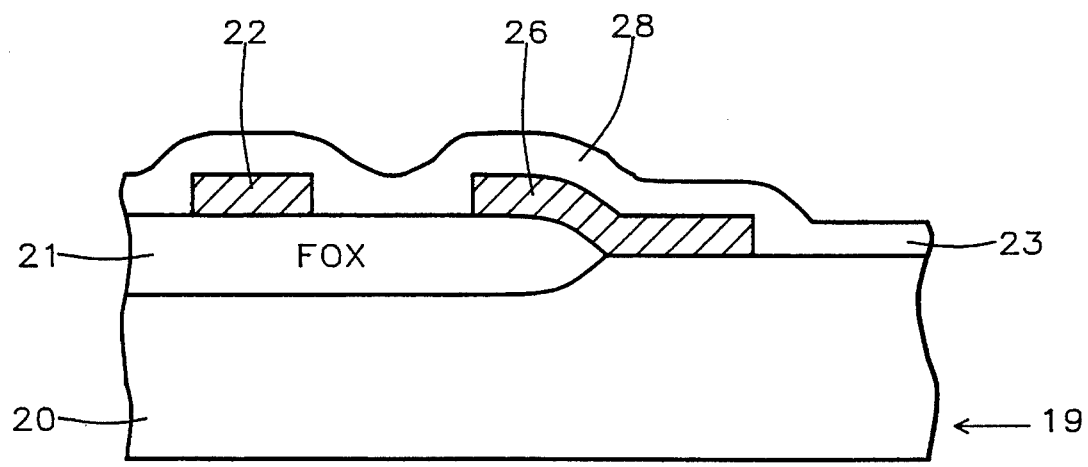
Figure 5:
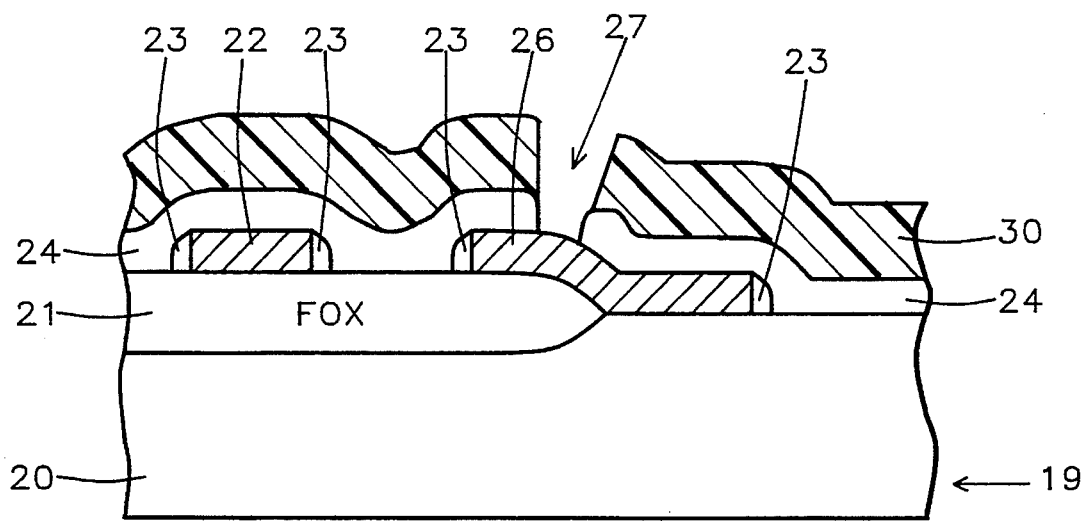

FIG. 4 shows the device of FIG. 4 after a blanket CVD deposit of silicon dioxide layer 23, made followed by a spacer etchback leaving the silicon dioxide spacers 23 shown in FIG. 5 on the ends of polysilicon 1 gate structures 22 and 26. Above the gate structures 22, 26 and spacers 23 and the exposed FOX region 21 and substrate 20 is formed an interpolysilicon structure 24. A photoresist layer is formed over interpolysilicon structure 24 and patterned into a mask 30 by means of photolithographically to provide an opening 27 therein above the polysilicon 1 gate 26.

Interpolysilicon structure 24 preferably has a thickness of from about 500 Å to about 2,500 Å, and it is preferably composed of "oxide" (silicon dioxide) but it can also be composed of "oxide", "nitride" ($Si_3N_4$), "oxide" or nitride oxide nitride. Interpolysilicon structure 24 can be formed by a process of LPCVD (Low Pressure Chemical Vapor Deposition), PECVD (Plasma Enhanced CVD) or HTOCVD (High Temperature Oxide) at temperature within the range 450° C. to 850° C. Using opening 27 in photoresist mask 30, the opening 27 is also etched through interpolysilicon structure 24. The interpolysilicon structure 24 is etched by means of dry (plasma) or wet (chemical) etching.

Figure 6A:
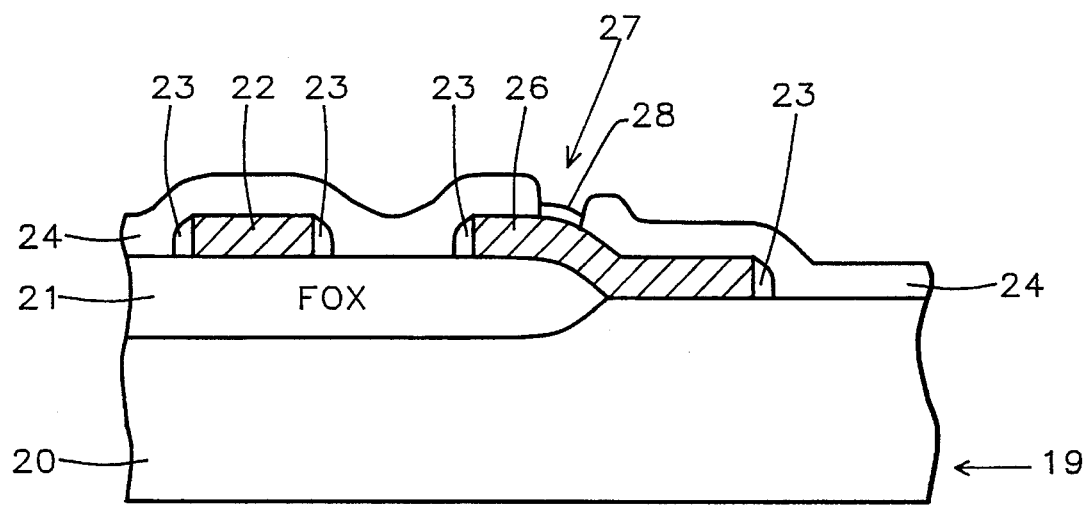
Figure 6B:
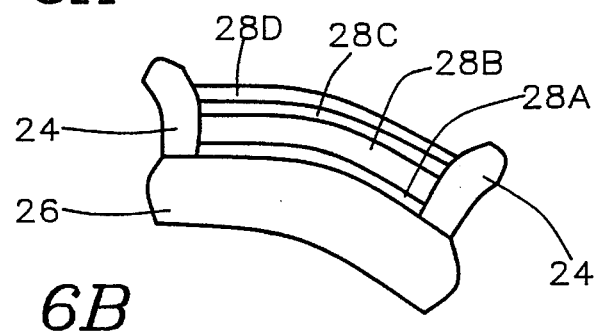

Then referring to FIG. 6A, which is the product of FIG. 5 after the mask 30 has been removed, a resistor 28 composed of a composite of dielectric films 28A/28B/28C/28D is formed as illustrated in FIG. 6B which are shown an exploded view of the resistor 28 and the surroundings of the device of FIG. 6A. The resistor material is composed preferably of an oxygen/nitrogen combination such as ONO ($SiO_2$/Silicon nitride/$SiO_2$), NO (Silicon nitride/$SiO_2$), or ON ($SiO_2$/Silicon nitride).

Preferably, an ONO film is formed as follows:

$O_b$ ($O_{bottom}$) $SiO_2$ deposition—film 28A

5 Å–10 Å native oxide (Clean wafer before $Si_3N_4$ deposition.)

N $Si_3N_4$ deposition—film 28B

60 Å–80 Å $Si_3N_4$ deposition

While lowering wafer loading temperature during deposition at from 700° C.–800° C. down to <300° C. with $N_2$ flow.

$O_t$ ($O_{top}$) $SiO_2$ deposition—film 28C

5 Å–10 Å

The composite resistor 28 has a small temperature coefficient of between about 10 ppm/°C. and about 50 ppm/°C. thermally grow oxide at from 700° C.–900° C. in steam to reduce pin holes.

After oxidation of $O_t$ the $Si_3N_4$ film is consumed in part and the thickness is reduced by about 5 Å to about 20 Å with a ratio of 3:1 oxide thickness growth to $Si_3N_4$ consumption.

Alternatively, in various embodiments of this invention, using various alternative processes and materials selected from ONO, NO or ON composite resistor 28 is applied thickness of from about 40 Å to about 80 Å.

The ONO film can be formed by a process described above.

The alternative ON film can be formed by a process as described above.

Next a thin film 28D composed of a thermal oxide ≦50 Å is applied on the surface of the composite dielectric resistor 28.

Figure 7:
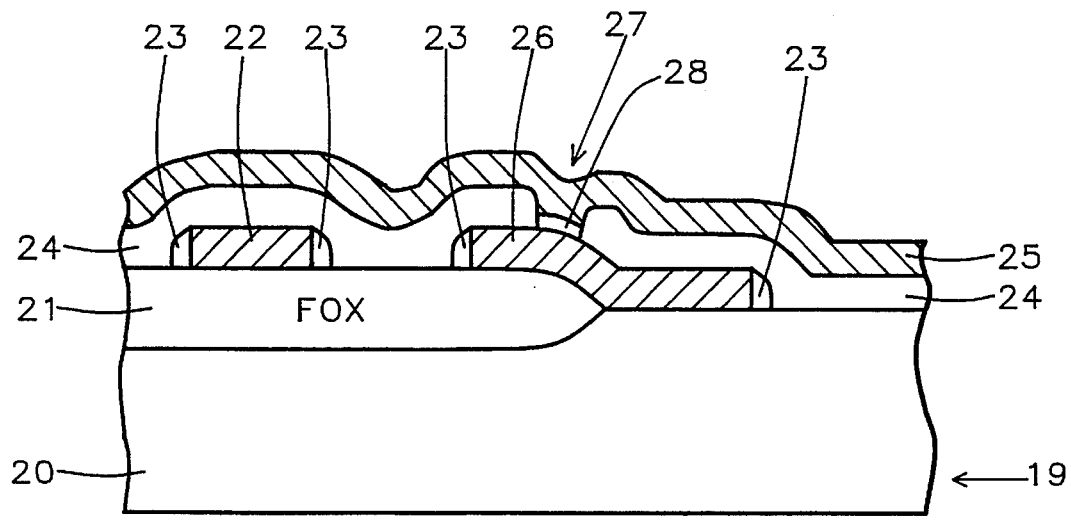

Next as shown in FIG. 7, a blanket interconnect layer 25 of polysilicon 2 material is formed over the preceding layers. Layer 25 is stacked over the composite resistor 28 through opening 27, such that layer 25 and composite resistor 28 are in electrical and mechanical contact.

Figure 8:
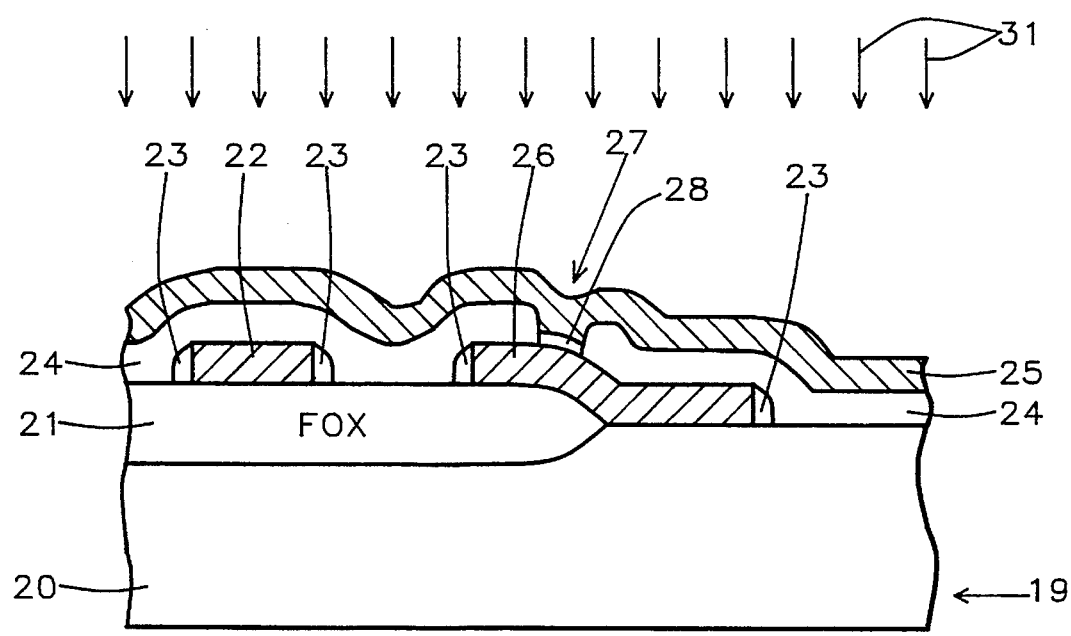

Subsequently, as shown in FIG. 8 the blanket interconnect layer is heavily doped by ion implantation with phosphorus or arsenic ions 31. The dose of the ions 31 implanted is within the range from about $5 \times E14$ $cm^{-2}$ to about $1 \times E16$ $cm^{-2}$ at an energy level from about 25 keV to about 60 keV.

Later the interconnect layer 25 is patterned by use of a mask and etching in accordance with the techniques employed above.

Figure 9A:
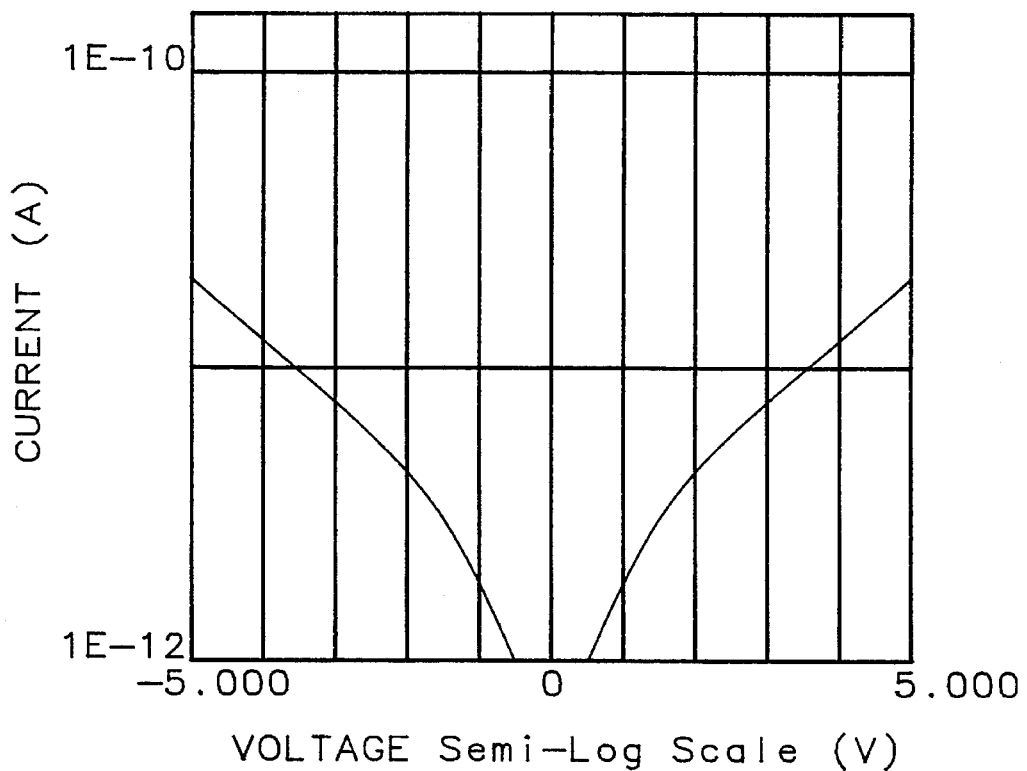
FIGS. 9A-9B are current-voltage characteristics for a conventional high resistance polysilicon load.
Figure 9B:
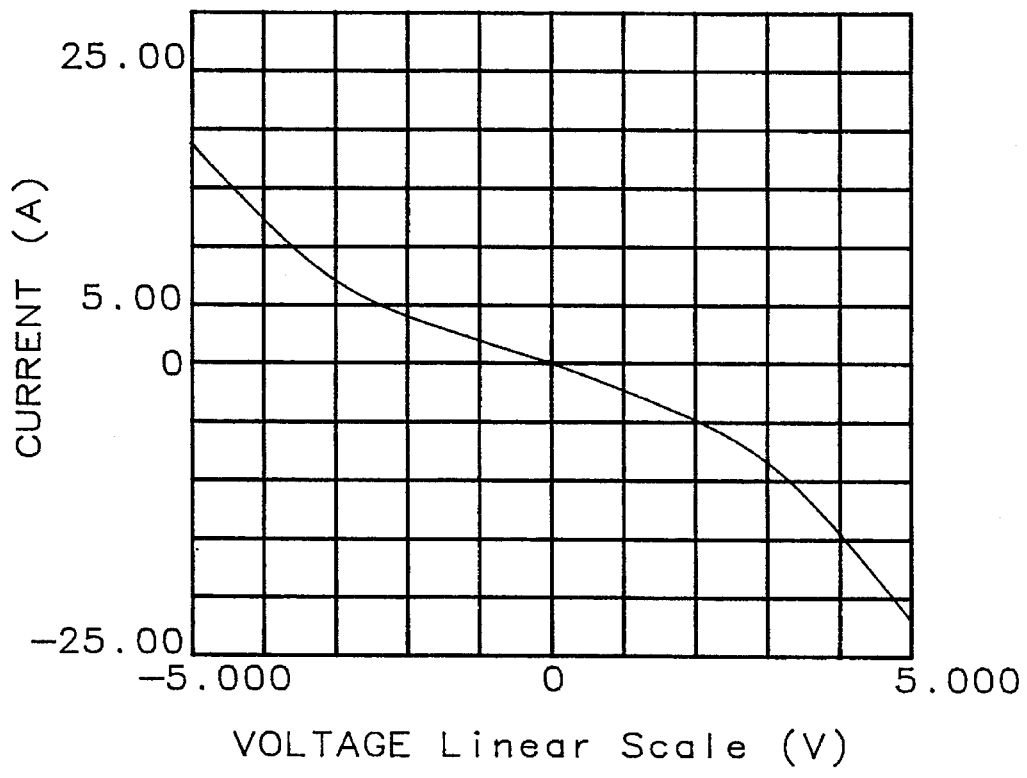

FIG. 9A and FIG. 9B are current-voltage characteristics for a conventional High-Resistance Polysilicon Load.

FIG. 9A shows a Current-Voltage characteristic on a semi-log scale. FIG. 9B shows the same data on a linear scale.

Figure 10A:
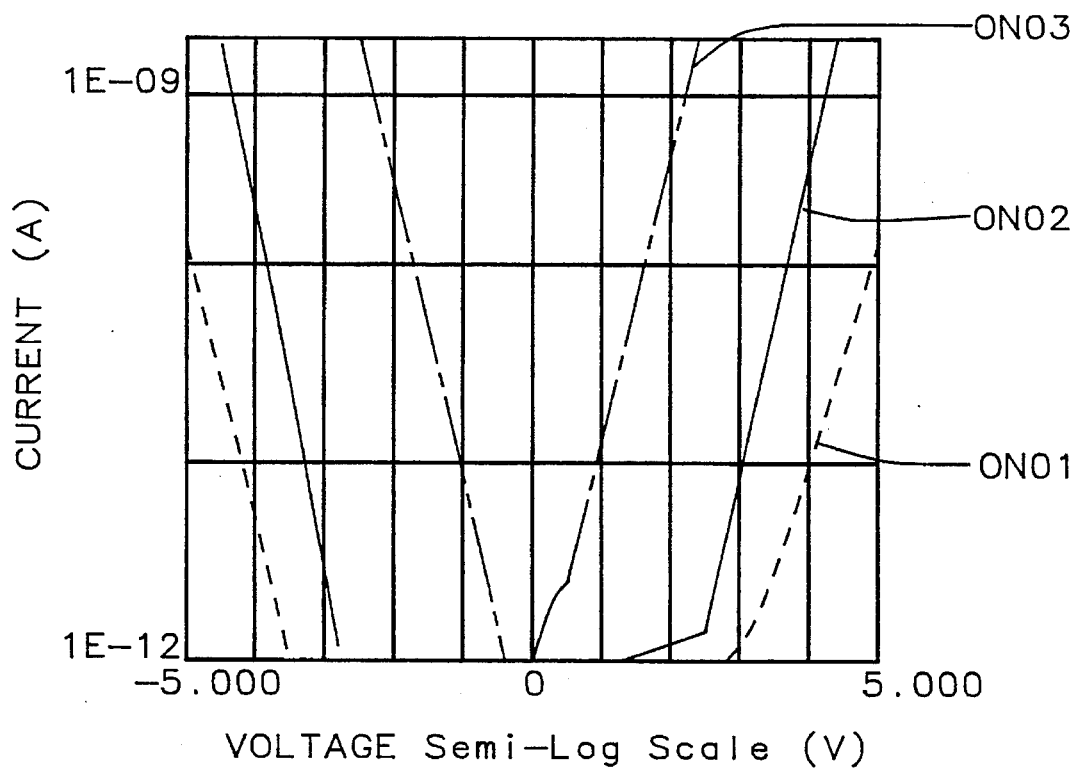
FIGS. 10A-10B are current-voltage characteristics for a polysilicon-thin ONO dielectric-polysilicon structure.
Figure 10B:
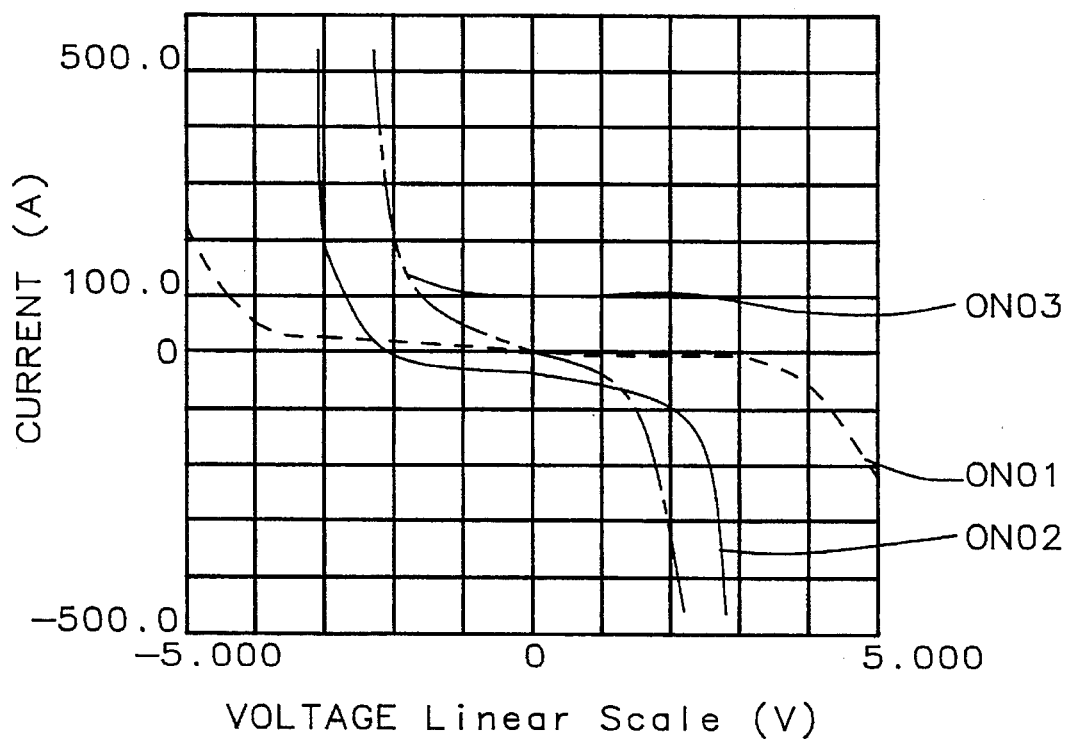

FIG. 10A and FIG. 10B show the current-voltage characteristics for are polysilicon-thin ONO dielectric-polysilicon structure. FIG. 10A is plotted on a semi-log scale. FIG. is plotted on a linear scale. Please note the similarity of the I–V characteristics between a polysilicon-R load and a thin ONO dielectric load. Different ONO thicknesses can alter the I–V characteristics significantly. Replacing ONO dielectric with ultra thin thermal oxide (less than or equal to 50 Å) will produce similar I–V characteristics.

The curves in FIGS. 10A and 10B are for several different ONO materials as stated in Table I.

TABLE I

| | |
|---|---|
| ONO1 | 65 |
| ONO2 | 58 |
| ONO3 | 40 |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor device on a semiconductor substrate including an SRAM cell with a resistor comprising formation of a first polysilicon layer on said semiconductor substrate, patterning and etching said first polysilicon layer, formation of an interpolysilicon layer over said first polysilicon layer, patterning and etching an opening through said interpolysilicon layer exposing a contact area on the surface of said first polysilicon layer, forming a dielectric load resistor in said opening upon said contact area on said first polysilicon layer, said dielectric load resistor having a temperature coefficient of between about 10 ppm/°C. and about 50 ppm/°C. and formation of a second polysilicon layer on said device over said dielectric load resistor and over said interpolysilicon layer.

2. The method of claim 1 wherein said second polysilicon layer is ion implanted with a dose of ions selected from phosphorous ions and arsenic ions implanted within the range from about $5 \times E14$ $cm^{-2}$ to about $1 \times E16$ $cm^{-2}$ at from about 25 keV to about 60 keV.

3. The method of claim 1 wherein said resistor is formed from ONO ($SiO_2$/Silicon nitride/$SiO_2$) and a thermal oxide layer having a thickness less than or equal to 50 Å.

4. The method of claim 1 wherein said resistor is formed from NO (Silicon nitride/$SiO_2$).

5. The method of claim 1 wherein said resistor is formed from ON ($SiO_2$/Silicon nitride).

6. The method of claim 3 wherein said resistor is formed by the steps as follows:

a) cleaning said device, b) growing a native oxide ($SiO_2$) layer, c) deposition of $Si_3N_4$, and d) thermally growing $SiO_2$.

7. The method of claim 3 wherein said resistor is formed by cleaning said device, growing a native oxide ($SiO_2$) layer having a thickness of from about 5 Å to about 10 Å, deposition of $Si_3N_4$ having a thickness of from about 60 Å to about 80 Å, and thermally growing $SiO_2$ having a thickness of from about 5 Å to about 10 Å at from 700° C.–900° C. in steam.

8. The method of claim 4 wherein said resistor is formed by deposition of $Si_3N_4$, and thermally growing $SiO_2$.

9. The method of claim 4 wherein said resistor is formed by deposition of $Si_3N_4$ having a thickness of from about 60 Å to about 80 Å, and thermally growing $SiO_2$ having a thickness of from about 5 Å to about 10 Å at from 700° C.–800° C. in steam.

10. The method of claim 5 wherein said resistor is formed by cleaning said device, applying a native oxide ($SiO_2$) layer, and deposition of $Si_3N_4$.

11. The method of claim 5 wherein said resistor is formed by cleaning said device, and forming a native oxide (SiO$_2$) layer having a thickness of from about 5 Å to about 10 Å, and deposition of Si$_3$N$_4$ having a thickness of from about 60 Å to about 80 Å.

12. A method of manufacture of a semiconductor device on a semiconductor substrate including an SRAM cell with a resistor comprising formation of a first polysilicon layer on said semiconductor substrate, patterning and etching said first polysilicon layer, formation of an interpolysilicon layer over said first polysilicon layer, patterning and etching an opening through said interpolysilicon layer exposing a contact area on the surface of said first polysilicon layer, forming a dielectric load resistor in said opening upon said contact area on said first polysilicon layer, said dielectric load resistor having a temperature coefficient of between 10 and 50 ppm/°C., formation of a second polysilicon layer on said device over said dielectric load resistor and over said interpolysilicon layer, said polysilicon layer being ion implanted with a dose of ions selected from phosphorous ions and arsenic ions implanted between 5×E14 cm$^{-2}$ and 1×E16 cm$^{-2}$ at between 25 keV and 60 keV, wherein said resistor is formed from ONO (SiO$_2$/Silicon nitride/SiO$_2$) and a thermal oxide layer having a thickness less than or equal to 50 Å, wherein said resistor is formed by the steps of cleaning said device; growing a native oxide (SiO$_2$) layer, deposition of Si$_3$N$_4$, and thermally growing SiO$_2$.

13. The method of claim 12 wherein said resistor is formed by cleaning said device, growing a native oxide (SiO$_2$) layer having a thickness of from 5 Å to 10 Å; deposition of Si$_3$N$_4$ having a thickness of from 60 Å to 80 Å, and thermally growing SiO$_2$ having a thickness of from 5 Å to 10 Å at from 700° C.–900° C. in steam.

14. The method of claim 12 wherein said resistor is formed by deposition of Si$_3$N$_4$ having a thickness of from 60 Å to 80 Å, and thermally growing SiO$_2$ having a thickness of from 5 Å to 10 Å at from 700° C.–800° C. in steam.

* * * * *